United States Patent [19]

Nagami

[11] 4,149,099
[45] Apr. 10, 1979

[54] AMPLIFIER CIRCUIT FOR OBTAINING TRUE AND COMPLEMENTARY OUTPUT SIGNALS FROM AN INPUT SIGNAL

[75] Inventor: Akira Nagami, Tokyo, Japan

[73] Assignee: Nippon Electric Co., Ltd., Tokyo, Japan

[21] Appl. No.: 831,820

[22] Filed: Sep. 9, 1977

[30] Foreign Application Priority Data

Sep. 10, 1976 [JP] Japan .................. 51/109169

[51] Int. Cl.² .................. H03K 3/286; H03K 3/353; H03K 5/20; G11C 8/00
[52] U.S. Cl. .................. 307/279; 307/264; 307/270; 307/362; 307/DIG. 1; 365/190; 365/230
[58] Field of Search .............. 307/264, 270, 279, 350, 307/DIG. 1, DIG. 5, 358, 362; 365/230, 231, 233, 189, 190; 307/247 R, 246

[56] References Cited

U.S. PATENT DOCUMENTS

| | | | |
|---|---|---|---|
| 3,796,893 | 3/1974 | Hoffman | 307/DIG. 5 X |
| 3,848,237 | 11/1974 | Geilhufe | 365/230 X |
| 3,906,464 | 9/1975 | Lattin | 307/DIG. 5 X |
| 3,938,109 | 2/1976 | Gionis et al. | 307/DIG. 1 X |
| 3,959,781 | 5/1976 | Mehta et al. | 307/279 X |
| 3,969,706 | 7/1976 | Proebsting et al. | 307/DIG. 5 X |
| 3,987,315 | 10/1976 | Matsue | 307/DIG. 1 X |
| 3,999,081 | 12/1976 | Nakajima | 307/214 X |
| 4,031,415 | 6/1977 | Redwine et al. | 307/DIG. 5 X |

Primary Examiner—Larry N. Anagnos
Attorney, Agent, or Firm—John M. Calimafde

[57] ABSTRACT

An amplifier circuit for amplifying an input signal and obtaining true and complementary output signals includes cross-coupled transistors connected to first and second nodes. The first and second nodes are made to be an equal potential by precharging. Then, the potential of the first node is either maintained or changed to a lower (in absolute value) level in response to and dependently on a control input signal, while the potential of the second node is slightly lowered (in absolute value) by dividing the precharged change of the second node with a capacitor. Thus, the first node is controlled by the input signal, while the second node is given a reference potential determined by a capacitance division ratio.

12 Claims, 7 Drawing Figures

AMPLIFIER CIRCUIT FOR OBTAINING TRUE AND COMPLEMENTARY OUTPUT SIGNALS FROM AN INPUT SIGNAL

BACKGROUND OF THE INVENTION

This invention relates to a circuit for amplifying an input signal and obtaining true and complementary output signals, and more particularly to a circuit of such kind using insulated-gate type field-effect transistors.

Recently, there has arisen a demand to have a circuit which is adapted to receive a minute TTL (transistor-transistor-logic) input signal and generates true and complementary logic outputs of an amplitude larger than the TTL input signal. Such a circuit finds a wide application, particularly as an address-inverter-buffer in a MOS memory integrated circuit, an input data generating circuit and a chip-selecting logic circuit. In these exemplified applications, the circuit receives, as an external input signal, an address signal, an input data signal or a chip-selecting signal and generates true and complementary output signals which are employed for decoder selection, determination of a level to be written into a memory cell, or prohibition of a data output circuit (for bringing an output data terminal to a high impedance). The requirements for this circuit are enumerated as below:

(1) The circuit should be operated at a low electric power. Since an integrated circuit such as a MOS memory integrated circuit incorporating the mentioned circuit includes a plurality of circuit blocks, there is required a low electric power circuit effecting a dynamic operation.

(2) An external input terminal capacitance should be minimized. This serves as a measure of allowance in an external driving capability in the practical application of a MOS memory integrated circuit or other integrated circuits incorporating the mentioned circuit.

(3) The circuit should provide an accelerated latch function. For enlarging the range of functions of the integrated circuits, it is essential that time to provide an effective input signal level be minimized.

(4) The circuit should provide both true and complementary outputs which are stable logically and well balanced. Requirement for an output high level is such that the rising of the both true and complementary outputs timely coincide with each other and the levels thereof be even. Requirement for an output low level is such that the level thereof should be sufficiently lower than a threshold voltage and should not affect the next stage. A requirement for accelerating an output results in unstable establishment of a logic level of an output, so that these requirements should be fulfilled to the very limits of an allowance. Accordingly, it has been a demand to have a circuit of an arrangement which is simple in action and judgement in achieving desired logical establishment and balance of both the true and complementary outputs.

Prior art circuits are disclosed in U.S. Pat. Nos. 3,938,109 and 3,987,315, which meet more or less the requirements (1) to (4). The circuit shown in FIG. 3 of U.S. Pat. No. 3,938,109 employs an external reference voltage source, while that of U.S. Pat. No. 3,987,315 receives true and complementary version of input signal. These prior art circuits fail to sufficiently satisfy the requirements (2) and (3). Improvement has been required for obtaining a high speed latch function and a very small input capacitance.

It is therefore an object of the present invention to provide a circuit which fulfills the aforesaid requirements to a possible maximum extent.

SUMMARY OF THE INVENTION

The circuit of the present invention comprises a pair of cross-coupled transistors connected to first and second nodes. These nodes are charged and made to have a substantially equal potential level in a first timing. The first node is then controlled by an input signal either to maintain its potential or to be changed to a low level (in absolute value). The potential of the second node is slightly lowered (in absolute value) in a second timing by dividing its initial potential with a capacitor. Thus, the potential of the second node in a second timing is determined by a capacitance division ratio. The cross-coupled transistors are activated favorably in a third timing. True and complementary output signals are derived from the first and second nodes. In a favorable manner, a capacitor is connected to the second node through a switch means which provides in a second timing a path for charges from the second node to the capacitor and lowers the potential of the second node in a capacitance division ratio. The capacitor is discharged before the second timing.

The present invention will now be described in more detail with reference to the accompanying drawings.

DESCRIPTION OF PREFERRED EMBODIMENTS

Description which will be given hereinafter refers to insulated-gate type field-effect transistors and more particularly to MOS transistors (hereinafter referred to as MOST's), typical of insulated-gate type field-effect transistors, of 'N' channel type. In the circuit using 'N' channel MOST's, high level is a logic '1' level and lower level is a logic '0' level. It is however needless to say that other types of transistors can be used for the circuit of the present invention. For example, 'P' channel MOST's may be used in place of the 'N' channel MOST's with changing the polarity of a power source.

Figure 2:
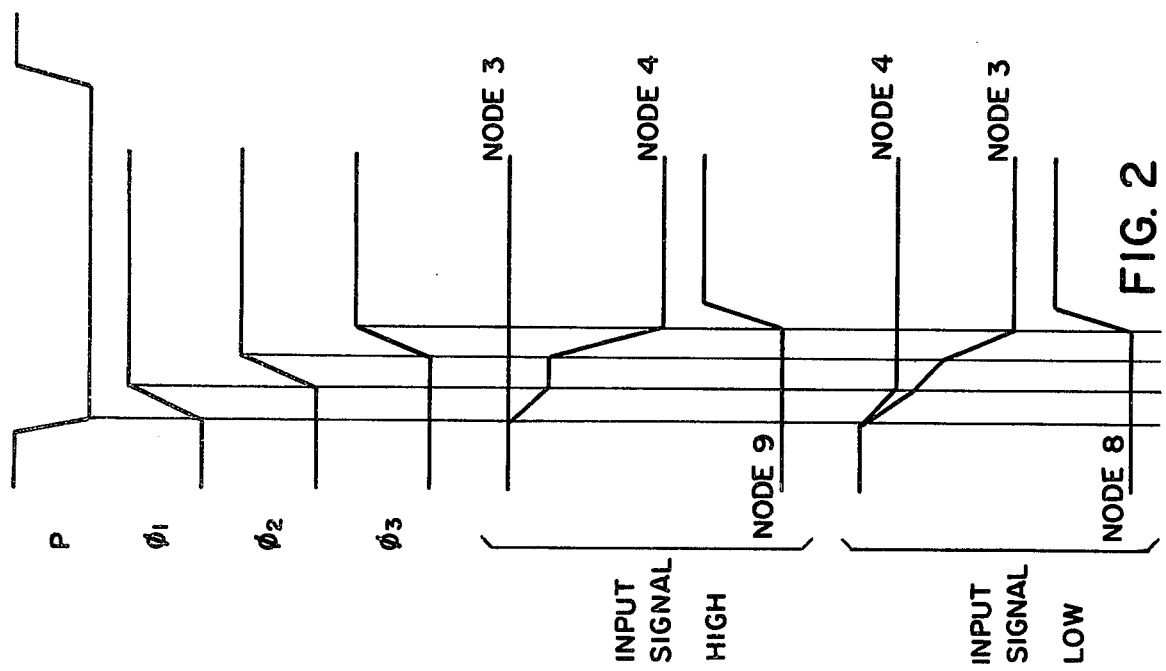
FIG. 2 is an operational wave-form diagram showing clock pulses to be applied to the circuit of FIG. 1 and wave-form at main nodes thereof.
Figure 1:
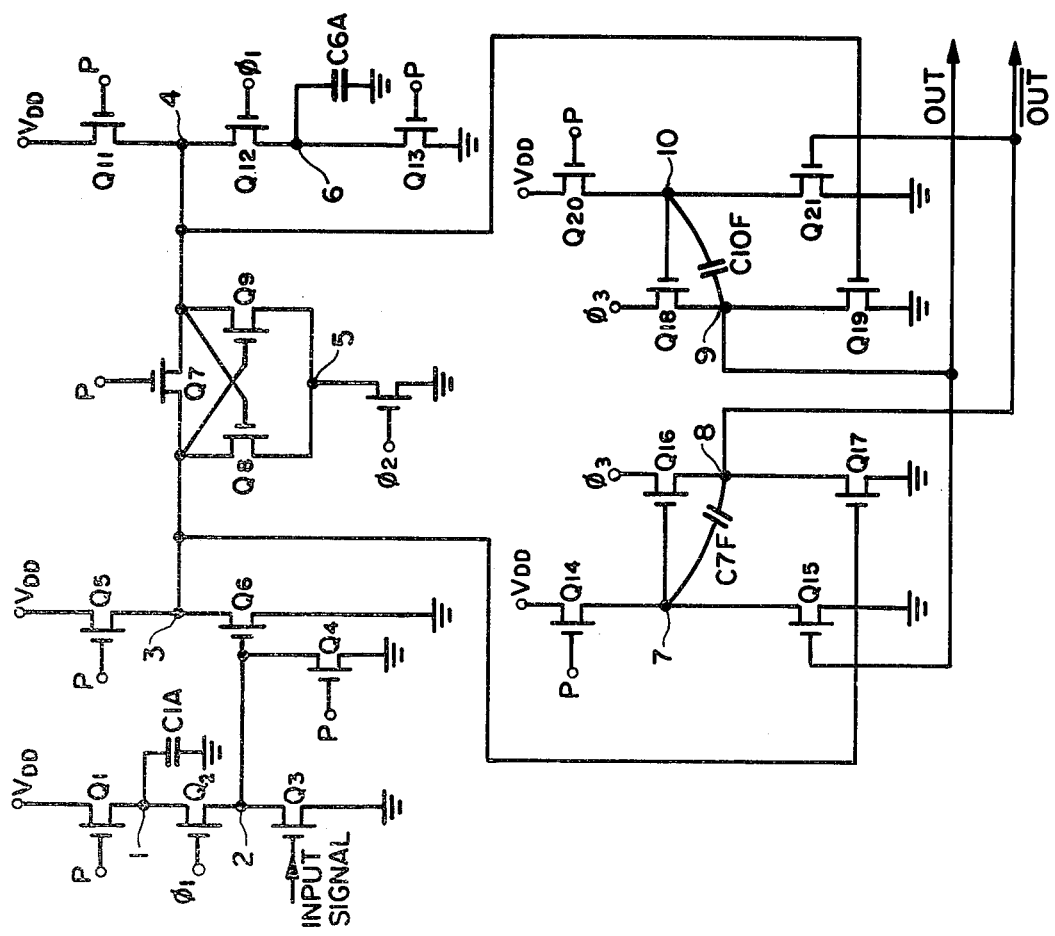
FIG. 1 is a circuit diagram showing a first embodiment of the present invention.

Now, a first embodiment of the invention is described with reference to FIGS. 1 and 2.

The high level of a precharging clock signal P is assumed to be a power source voltage $V_{DD}$, while the high level of other clock signals $\phi_1$, $\phi_2$, $\phi_3$ is assumed to be $(V_{DD} - V_T)$, where $V_T$ represents a threshold voltage of MOST employed. When a precharging signal P is at a high level, and other signals $\phi_1$, $\phi_2$, $\phi_3$ remain at a low level, the circuit is brought to a reset condition, and nodes 1, 3, 4, 7 and 10 in FIG. 1 are at a level of ($V_{DD}-V_T$), while the node 5 is at a level ($V_{DD}-2\times V_T$) and nodes 2, 6, 8, 9 are at a ground potential. Capacitors C1A and C6A having specific values are connected to the nodes 1 and 6. The capacitor C1A is charged to a level ($V_{DD}-V_T$), and the capacitor C6A remains in a discharged condition. In addition, boot strap capacitors C7F, C10F are both charged to a level ($V_{DD}-V_T$). When the signal P is shifted to a low level for the first time, then MOST's Q1, Q4, Q5, Q7, Q11, Q13, Q14 and Q20 will be non-conducting, and the nodes 1, 3, 4, 7, 10 remain unchanged in level, i.e., at a floating potential. Then, when the signal $\phi_1$ is brought to a high level, the MOST's Q2 and Q12 become conducting, so that there is incurred a change in level of nodes 1, 2, 3, 4 and 6. In this respect, a change in level of nodes 1, 2 and 3 is dependent on an input signal. Meanwhile, before the level of a signal $\phi_1$ is raised, the input signal should have been settled at a logic level, and the setting time of an input signal is dependent on the signal $\phi_1$. In case an input signal is at a low level, and MOST Q3 is non-conducting, charges at the node 1 is shifted through MOST Q2 to the node 2, so that the level of the node is raised to a level;

$$V_2 = \frac{C_1}{C_1 + C_2} \times (V_{DD} - V_T) \quad (2),$$

according to a charge equilibrium condition:

$$C_1 \times (V_{DD} - V_T) = (C_1 + C_2) \times V_2 \quad (1),$$

wherein C1 and C2 represent capacitances of the nodes 1 and 2, respectively. C1 includes the capacitance of the capacitor C1A and other capacitances such as parasitic capacitances at the node 1. A time constant, upon the rising of level of node 2, is dependent on a resistance of MOST Q2 when conducting and the capacitance C2. On the other hand, in case an input signal is at a high level, when MOST Q2 becomes conducting, then charge at the junction 1 is discharged through a series path of MOST Q2 and Q3. The current capacity of MOST Q3 should be such that the level at node 2 during the above discharging period does not exceed a threshold voltage. In other words, a dimension W/L of MOST Q3 should be determined to satisfy this requirement (L represents a channel length, and W represents a channel width.). When an input signal is at a low level, MOST Q6 becomes conducting due to a rising level of the node 2 (The final level is represented by the equation (2)), so that the charged level ($V_{DD}-V_T$) at the node 3 is lowered. When an input signal is at a high level, the node 2 is maintained at a level below a threshold voltage, and MOST Q6 remains in a non-conducting condition, while the node 3 maintains a charged level ($V_{DD}-V_T$). On the other hand, when the level of pulse $\phi_1$ raised, then MOST Q12 becomes conducting, so that charge at the node 4 is shifted to the node 6. As a result, the potential at the node 4 comes close to a value, as follows:

$$V_4 = \frac{C_4}{C_4 + C_6} \times (V_{DD} - V_T) \quad (4)$$

according to the charge equilibrium condition as below:

$$C_4 \times (V_{DD} - V_T) = (C_4 + C_6) \times V_4 \quad (3)$$

wherein C4 and C6 represent capacitances at the nodes 4 and 6, respectively. A time constant, upon a change in level of the node, is dependent on a resistance of MOST Q12, when conducting, and on the capacitance C6. A difference in level, at which a flip flop circuit consisting of MOST Q8, Q9, and Q10 may be operated, with a high level maintained at the nodes 3 or 4, is produced at the nodes 3 and 4, after which the level of signal $\phi_2$ is raised. For this reason, it is required that, when an input signal is at a low level, the level at the node 2 be raised so that a potential at the node 3 may be lowered with reference to the level of node 4, as compared with an off-set voltage of the flip flop circuit consisting of MOST Q8, Q9, Q10, and a capacitance of the node 1 should be adjusted so as to increase the capacitance of the capacitor C1A. When an input signal is at a high level, the capacitance of node 6 should be adjusted so as to increase the capacitance of the capacitor C6A, thereby lowering the potential at the node 4 to an extent sufficiently below a level ($V_{DD}-V_T$) at the node 3. When the level of signal $\phi_2$ is raised. MOST Q10 becomes conducting. When an input signal is at a low level due to the flip-flop operation of MOST Q8, Q9, the level of node 3 is lowered to a ground potential, while the node 4 is maintained at a level represented by the equation (4). When an input signal is at a high level, the node 3 remains at a level ($V_{DD}-V_T$), while the node 4 is lowered toward a ground potential. Accordingly, in the case of an input signal being at a low level, MOST Q17 becomes non-conducting, and in the case of an input signal being at a high level, MOST Q19 becomes non-conducting. When the level of signal $\phi_3$ is raised, then there may be derived true and complementary outputs at the nodes 8 and 9. When an input signal is at a low level, MOST Q17 remains non-conducting, and when the level of signal $\phi_3$ is raised, then the level at the node 8 begins rising through MOST Q16 which is conducting, while the level at the node 7 is raised to a level $$(V_{DD} - V_T + \frac{C_7F}{C_7 + C_7F} \times V_8)$$

due to a boot strap capacitor C7F. In this respect, C7 is a capacitance of the node 7, and V8 is a voltage at the node 8. MOST Q16 maintains a non-saturated region, and the same rising wave form as that of the signal $\phi_3$ may be derived at the node 8 in synchronism with the signal $\phi_3$. On the other hand, the level at the node 9 tends to rise through MOST Q18, when an signal $\phi_3$ is fed. However, the dimensions of MOST Q19 is sufficiently increased so as to hold the level at the node 9 sufficiently lower than a threshold voltage. In other words, MOST Q18 and Q19 maintain the node 9 at a low level due to the dimensions of MOST Q19 being sufficiently increased, as compared with that of MOST Q18, because the gate potentials of Q18 and Q19 are brought to a level ($V_{DD}-V_T$) and the level of equation (4), respectively, and thus Q18 and Q19 are both conducting. When the level at the node 8 is raised, MOST Q21 becomes conducting, so that the charged level ($V_{DD}-V_T$) at the node 10 is shifted to a ground potential, and as a result, the level at node 9 is brought to a ground potential through MOST Q19. When an input signal is at a high level, MOST Q19 remains non-conducting. When the level of signal $\phi_3$ is raised, then the level at node 9 begins rising through MOST Q18 which is conducting, while the level at node 10 begins rising to a level $$(V_{DD} - V_T + \frac{C_{10}F}{C_{10} + C_{10}F} \times V_9)$$

due to the boot strap capacitor 10F, wherein C10 represents a capacitance of the node 10, and V9 represents a voltage at the node 9. MOST Q18 maintains a non-saturated region, while there may be achieved for the node 9 a rising wave form in synchronous with the signal $\phi_3$. On the other hand, when the signal $\phi_3$ is applied, then the level at node 8 tends to rise through MOST Q16. However, the dimensions of MOST Q17 is sufficiently increased so as to hold a threshold voltage as low as possible. MOST Q16 and Q17 are both conducting at gate potential of a level ($V_{DD} - V_T$), so that by increasing the dimensions of MOST Q17 as compared with those of the MOST Q16, the node 8 is maintained at a low level. When the level at node 9 is raised, then MOST Q15 becomes conducting, so that the charged level of ($V_{DD} - V_T$) at the node 7 is shifted to a ground potential, and hence MOST Q16 becomes non-conducting. As a result, the level at node 8 as well is brought to a ground potential through MOST Q17.

Description has been given thus far of the functions of the circuit, that when an input signal is at a low level, the level at node 8 is raised, and the level at node 9 is maintained at a low level, and that when an input signal is at a high level, the level at node 9 is raised, and the level at node 8 is maintained at a low level.

This circuit affords the following features for aforesaid the requirements (1) to (4):

(1) This circuits provides a dynamic operation, so the electric power consumption may be minimized.

(2) An input-terminal-capacitance is dependent on the dimensions of MOST Q3. MOST Q3 should provide a capability and dimensions such that, when an input signal is at a high level, MOST Q3 discharges the charges at node 1 in cooperation with MOST Q2, after the level of signal $\phi_1$ has risen. Since the input signal is at a TTL Level, MOST of dimensions having a sufficient allowance is required. However, in this case, when MOST Q1 becomes non-conducting, floating charges stored at the node 1 is discharged, so that the dimensions of MOST Q3 may be minimized.

(3) The input signal should be set to an effective logical level before the level of signal $\phi_1$ is raised, and should be maintained throughout the following process; that is, the signal $\phi_2$ is raised, and a flip flop circuit consisting of MOST Q8, Q9 and Q10 is operated, so that the logic level sufficient for driving MOST Q17 and A19 may be obtained at the nodes 3 and 4. The optimum rising of a timing signal $\phi_2$ brings about an accelerated latch function.

(4) A high level output wave form having a coincident rising timing and a low level output wave form which is sufficiently lower than a threshold voltage are required for the nodes 8 and 9. When the level of signal $\phi_2$ is raised, the logic level is established at the nodes 3 and 4. In this case, an accelerated response may be achieved, if a difference in potential between the nodes 3 and 4 is sufficiently large and well balanced for the flip-flop operation of MOST Q8 and Q9. When an input signal is at a high level or a low level, consistent operational wave forms may be achieved. Accordingly, MOST Q19 when an input signal is at a high level, and MOST Q17 when MOST Q19 is at a low level may be rendered non-conducting substantially simultaneously, so that there may be derived at the nodes 9 and 8 high level output wave forms having a coincident rising timing and level, respectively. On the other hand, a low level output which is sufficiently lower than a threshold voltage may be derived at the nodes 9 and 8, by increasing the dimensions of MOST Q19, as compared with those of MOST Q18, when an input signal is at a low level, as has been described earlier, and by increasing the dimensions of MOST Q17 as compared with those of the MOST Q16 when an input signal is at a high level.

Figure 3:
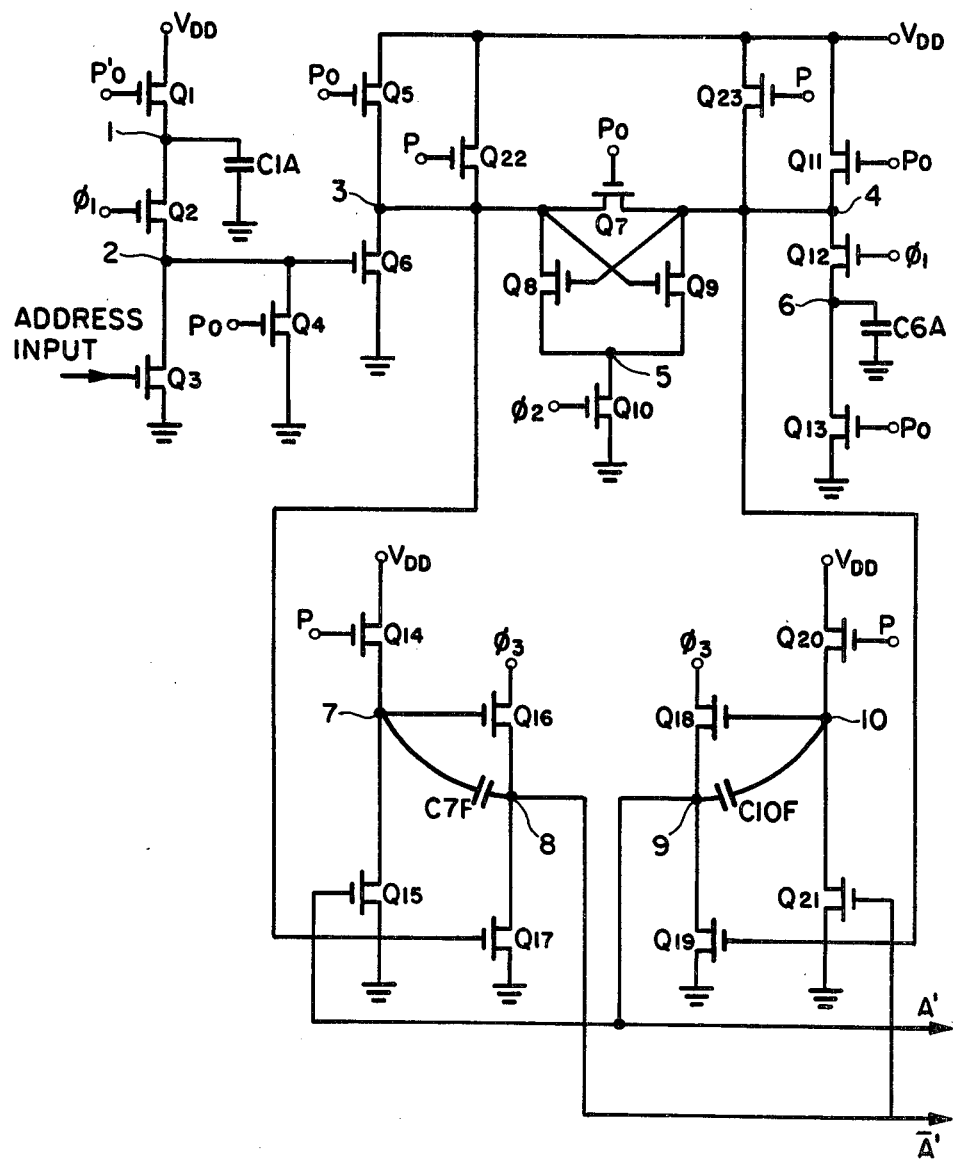
FIG. 3 is a circuit diagram showing a second embodiment of the invention.

FIG. 3 shows a second embodiment of the invention, which is an example of a circuit for use as an address-inverter-buffer circuit for a memory circuit. Like parts are designed like reference numerals for common use with those of FIG. 1. The difference between the circuit of FIG. 3 and the circuit of FIG. 1 is that (i) MOST Q22 and Q23 whose gates are supplied with a timing signal P are connected between the nodes 3, 4 and a power source $V_{DD}$, respectively, in addition to the precharging MOST Q5 and Q11, (ii) a signal Po is applied to respective gates of MOST Q4, Q5, Q7, Q11 and Q13, in place of the timing signal P, and (iii) a signal Po' is impressed on the gate of MOST Q1 in place of the timing signal P. This circuit receives a small signal input of a TTL level at the gate of MOST Q3 as an input signal, and provides MOS level complementary address signals $\overline{A'}$, $A'$ at the nodes 8 and 9 as outputs. The other arrangements remain unchanged, as compared with those of the embodiment of FIG. 1.

Figure 4:
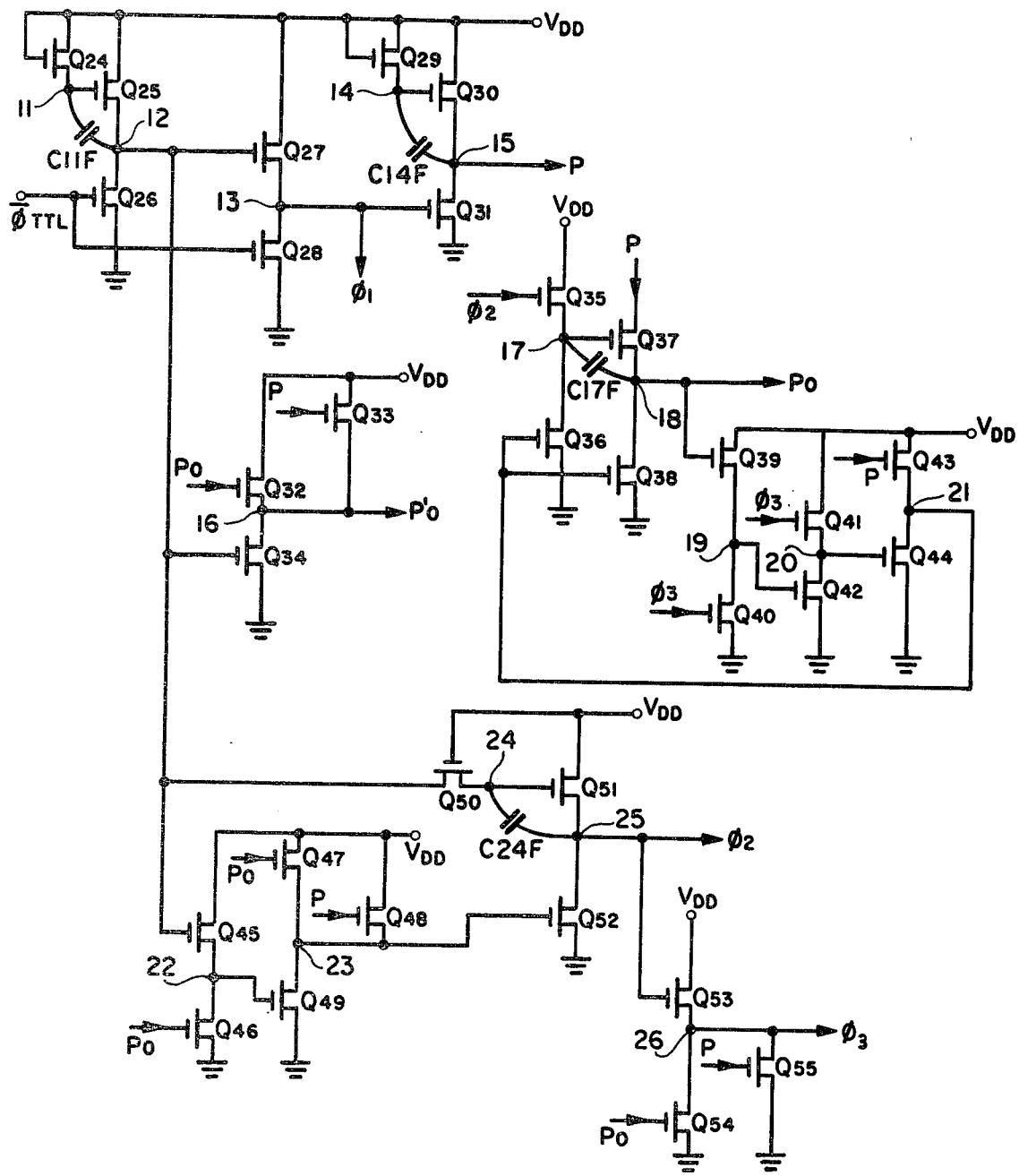
FIG. 4 is a timing signal generating circuit to be used for the circuit of FIG. 3.
Figure 5:
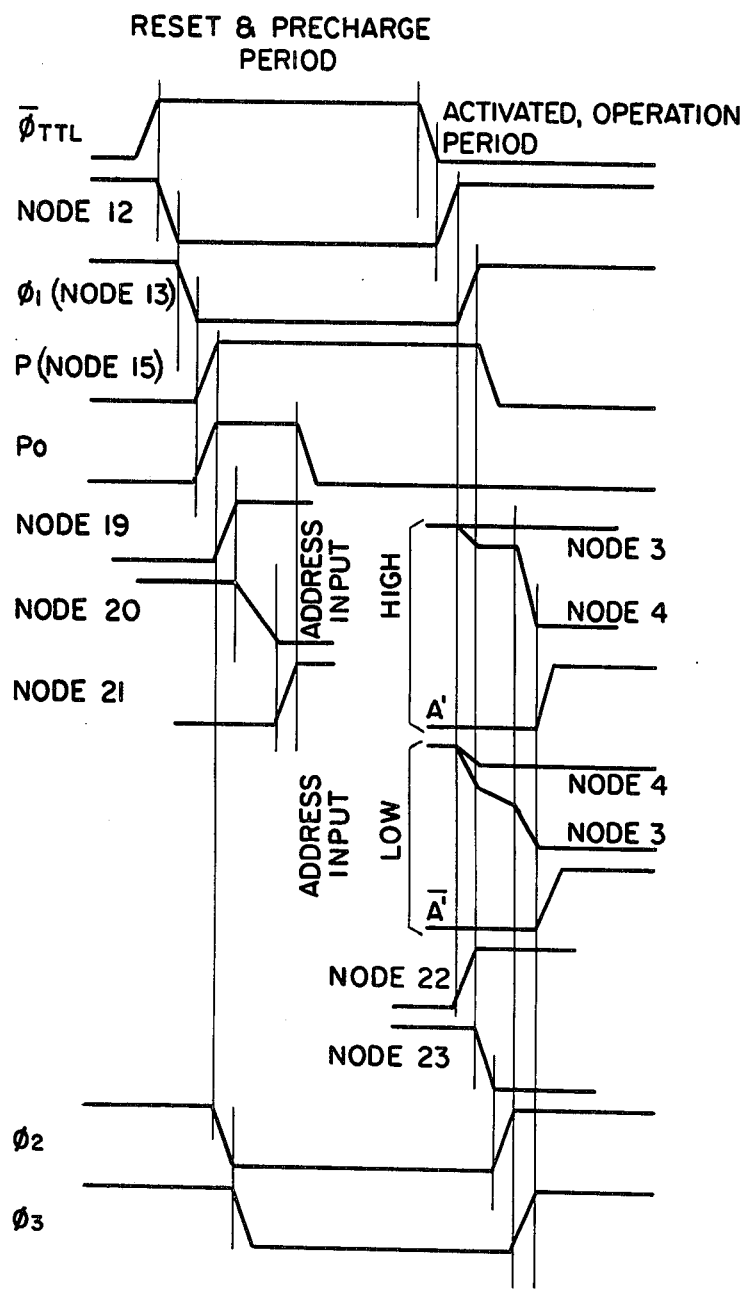
FIG. 5 is wave-form diagram for explaining the operation of the circuits of FIGS. 3 and 4.

FIG. 4 shows a circuit for generating respective timing signals used in the circuit of FIG. 3, while FIG. 5 shows the wave-forms thereof. According to the circuit of FIG. 4, clock signals ($\phi_1$, $\phi_2$, $\phi_3$, P, Po and Po') are generated according to an input clock signal $\overline{\phi_{TTL}}$ of an external TTL level. As shown in FIG. 5, an activated operating period is a period, during which the clock pulse input $\overline{\phi_{TTL}}$ is maintained at a low level, and a resetting and precharging period is a period, during which the above clock pulse is maintained at a high level. In addition, when the input $\overline{\phi_{TTL}}$ is shifted from a high level to a low level, then the resetting and precharging timing signal is reset to a low level, so that timing signals $\phi_1$, $\phi_2$, $\phi_3$ are generated sequentially, thereby providing desired response wave forms at A and $\overline{A'}$. In an address-inverter-buffer circuit of FIG. 3, the timing signal Po is used for precharging the nodes 1, 3, and 4, and resetting the node 2 and node 6. The signal Po serves, as shown in FIG. 5, to accomplish its mission during the resetting and precharging period and is then shifted to a low level, thereby accelerating the operational speed of the circuit which has entered an activated operational period. The operation of circuits of FIGS. 3 and 4 depends on the timing signal Po as one of functions, so that description will begin with the shifting of the input signal $\phi_{TTL}$ from its low level to its high level. Since the dimension of MOST Q26 is larger than that of MOST Q25, the level at node 12 is shifted to a level which is sufficiently lower than a threshold voltage, then MOST Q27, Q34, Q45, and Q51 become non-conducting, and then the timing signal $\phi_1$ is shifted to a ground potential. When MOST Q31 becomes non-conducting, then the level of timing signal P begins rising through MOST Q30 which is conducting, and then the level at node 14 is raised to a level $$(V_{DD} - V_T + \frac{C_{14}F}{C_{14} + C_{14}F} \times V_{15})$$

due to the boot strap capacitor C14F, wherein C14 represents a capacitance of the node 14, and $V_{15}$ represents a voltage at the node 15. The level of signal P reaches a $V_{DD}$ level. Referring to the generating circuit for the timing signal Po, the level at the node 21 remains at a ground potential, and MOST Q36 and Q38 are non-conducting, while the node 17 is charged to a level $(V_{DD}-V_T)$ according to the signal $\phi_2$. When the level of signal P is being raised, then the level of signal Po begins rising through MOST Q37, so that the level at the node 17 is raised to a level $$(V_{DD} - V_T + \frac{C_{17}F}{C_{17} + C_{17}F} \times V_{18})$$

due to the boot strap capacitor C17F. In this respect, C17 represents a capacitance of the node 17, and $V_{18}$ represents a voltage at the node 18. MOST Q37 is maintained in an non-saturated region, and there may be achieved a rising wave form for the signal Po, which is substantially synchronous with the signal P. Due to the rising of level of signal P, the signal $\phi_2$ is shifted to a ground potential, followed by the signal $\phi_3$, so that MOST Q40 and Q41 are rendered non-conducting. Due to the rising of level of signal Po, the level at node 19 is raised to a level $(V_{DD}-V_T)$ through MOST Q39, so that MOST Q42 becomes conducting, thereby bringing the charge level of $(V_{DD}-V_T)$ at the node 20 down to a ground potential. The dimension of MOST Q44 is sufficiently large, as compared with that of the MOST Q43. When the level at the node 20 is lowered below a threshold voltage and MOST Q44 becomes non-conducting, then the level at node 21 is raised to a level $(V_{DD}-V_T)$ through MOST Q43. As a result, MOST Q36 and Q38 become conducting, and the potential at node 17 is lowered to a ground potential, MOST Q37 becomes non-conducting, and then the level of signal Po is shifted to a ground potential. The suitable time, in which the signal Po maintains a high level, determined by adjusting the dimensions of MOST Q39, Q42 and Q44 is needed so as to precharge the nodes 3, 4, in FIG. 3 and 16 (Po') and 23 in FIG. 4 to a level $(V_{DD}-V_T)$. Also in this respect, a sufficient allowance should be taken so as to reset to a ground potential the levels at nodes 2, 6 in FIG. 3 and the nodes 22 and 26 ($\phi_3$) in FIG. 4. During the period, in which the input signal $\overline{\phi_{TLL}}$ is at a high level, in case the resetting and precharging period is long, the nodes to be precharged by the signal Po maintains a floating high level potential, so that there is a possibility of the level attenuating due to leak current. MOST Q22 and Q23 in FIG. 3, and Q33 and Q48 in FIG. 4 prevent this level attenuation, and thus the dimensions thereof should be reduced so as not to affect the circuit operation. The signal P substantially synchronizes with the input signal $\overline{\phi_{TTL}}$ and maintains the $V_{DD}$ level, thereby aiding in the precharging due to the signal Po and resetting of the signal $\phi_3$ as well as precharging the nodes 7 and 10 in FIG. 3 to a level $(V_{DD}-V_T)$. Upon the completion of resetting and precharging operations in this manner, the input signal $\overline{\phi_{TTL}}$ is shifted from a high level to a low level, thus enabling the circuit to enter an activated operational period. When an input signal $\overline{\phi_{TTL}}$ goes below a threshold voltage, then MOST Q26 and Q28 become non-conducting, and then the node 12 begins rising through MOST Q25 which is conducting, so that the level at node 11 is raised to a level $$(V_{DD} - V_T + \frac{C_{11}F}{C_{11} + C_{11}F} \times V_{12})$$

due to the boot strap capacitor C11F. In this respect, C11 represents a capacitance of the node 11, and $V_{12}$ represents a voltage at the node 12. The node 12 reaches a $V_{DD}$ level. The raised level at node 12 causes MOST Q34 to be conducting, and the signal Po' is immediately shifted to a ground potential, so that MOST Q1 in FIG. 3 becomes non-conducting. From this time on, the node 1 of FIG. 3 is shifted to a floating high level potential of a level $(V_{DD}-2\times V_T)$. The rising of the level at node 12 also causes the signal $\phi_1$ to rise to a level $(V_{DD}-V_T)$ through MOST Q27. The rising in level of the signal $\phi_1$ causes MOST Q2 to be conducting, and the charges at node 1 are shifted to the node 2. An address input signal should be set to an effective level, before the signal $\phi_1$ is raised. When the address input signal is at a low level, MOST Q3 remains non-conducting, and the node 2 is raised to a level:

$$V_2 = \frac{C_1}{C_1 + C_2} \times (V_{DD} - 2 \times V_T) \quad (5),$$

wherein C1 and C2 represent capacitances of the nodes 1 and 2, respectively. When the address input signal is at a high level, MOST Q2 and Q3 discharge the charges at the node 1, so that the level at node 2 may be maintained below a threshold voltage by assuming the dimension of MOST Q3 suitable. On the other hand, when the level of signal $\phi_1$ is raised, MOST Q12 becomes conducting, and the level at node 4 is shited from the charged level of $(V_{DD}-V_T)$ to a level:

$$V_4 = \frac{C_4}{C_4 + C_6} \times (V_{DD} - V_T) \quad (6),$$

wherein C4 and C6 represents the capacitances of nodes 4 and 6, respectively. Accordingly, when the address input level is low, MOST Q6, becomes conducting, so that the gate potential i.e., the level at node 2 is raised to a level of the equation (5), as far as the input signal is maintained at a low level, with the result that the level at node 3 eventually becomes close to a ground potential. On the other hand, the level at node 4 comes close to the level of the equation (6), so that the level at node 3 is immediately lowered, as compared with that of the node 4. When the address input signal is at a high level, MOST Q6 remains non-conducting, the node 3 is maintained at a level $(V_{DD}-V_T)$ and the node 4 at a level of the equation (6). As a result, the level of node 3 is higher than that of node 4 by an increment of:

$$V = \frac{C_6}{C_4 + C_6} \times (V_{DD} - V_T) \quad (7)$$

The level of signal $\phi_2$ may be raised, when the above difference in potential exceeds an off-set voltage at the flip flop circuit consisting of MOST Q8 and Q9. The signal $\phi_2$ is generated due to a raised level at the node 12, as follows: The level at the node 24 is raised to a level $(V_{DD}-V_T)$ by being charged through MOST Q50 due to the rising of level at the node 12, while the level at the node 22 is raised to a level $(V_{DD}-V_T)$ through MOST Q45, so that the charge level of $(V_{DD}-V_T)$ at the node 23 is shifted to a ground potential due to MOST Q49. The dimensions of MOST Q52 are sufficiently larger than those of MOST Q51. As a result, after MOST Q52 has been non-conducting, the level of signal $\phi_2$ begins rising through MOST Q51, and level at the node 24 is raised to a level $$(V_{DD} - V_T + \frac{C_{24}F}{C_{24} + C_{24}F} \times V_{25})$$

due to the boot strap capacitor C24F. In this respect, C24 represents a capacitance at the node 24, and $V_{25}$ represents a voltage at the node 25. The signal $\phi_2$ reaches a $V_{DD}$ level. The rising of the signal $\phi_2$ should be adjusted by varying the dimensions of MOST Q45 and Q49 so as to obtain a sufficiently large difference in potential between the node 3 and the node 4. When the level of signal $\phi_2$ is raised, then MOST Q10 becomes conducting, and the level at the node 3 is lowered to a ground potential, when the address input signal is at a low level according to the flip flop operation of MOST Q8 and Q9, while the level at node 4 is maintained intact at a level of the equation (6). On the other hand, when an input signal is at a high level, the level at node 3 remains at a level ($V_{DD}-V_T$), and the level at node 4 is lowered to a ground level. Due to the rising of level of the signal $\phi_2$, the signal $\phi_3$ is raised to a level ($V_{DD}-V_T$) through MOST Q53. When the address input signal is at a low level, the level at the node 3 remains at a ground potential, and MOST Q17 remains non-conducting. An output signal $\overline{A'}$ begins rising through MOST Q16, and the level at node 7 is raised to a level $$(V_{DD} - V_T + \frac{C_7}{C_7 + C_7F} \times V_8)$$

due to the boot strap capacitor C7F. In this respect, C7 represents a capacitance of the node 7, and $V_8$ represents a voltage at the node 8. MOST Q16 is maintained in a non-saturated region, and a rising wave form which follows the signal $\phi_3$ may be derived for the output signal $\overline{A'}$. On the other hand, the node 4 remains at a level of the equation (6). Thus, by increasing the dimensions of MOST Q19 sufficiently, as compared with those of MOST Q18, the output signal may be maintained at a level which is sufficiently lower than a threshold voltage. When the output $\overline{A'}$ is raised, the MOST Q21 becomes conducting and the signal P has been brought to a low level due to the rising of the signal $\phi_1$, so that MOST Q20 remains non-conducting and the level at node 10 is lowered to a ground potential. As a result, MOST Q18 becomes non-conducting, and the level of output A' is lowered to a ground potential. When the address input signal is at a high level, the level at node 4 has been shifted to a ground potential, so that MOST Q19 remains non-conducting, the output A' begins rising through MOST Q18 which is conducting, and the level at node 10 is raised to level $$(V_{DD} - V_T + \frac{C_{10}F}{C_{10} + C_{10}F} \times V_9)$$

due to the boot strap capacitor C10F. In this respect, C10 represents a capacitance of the node 10, and $V_9$ represents a voltage at the node 9. MOST Q18 is maintained in a non-conducting region, while a rising wave form which follows the signal $\phi_3$ is derived for the output A'. The node 3 remains at a level ($V_{DD}-V_T$). By assuming the dimension of MOST Q17 suitable, as compared with that of MOST Q16, the output $\overline{A'}$ of the node 3 may be maintained at a sufficiently low level below a threshold voltage. When an output A' is raised, then MOST Q15 becomes conducting and the level at node 7 is lowered to a ground potential. As a result, MOST Q16 becomes non-conducting, and the output $\overline{A'}$ is settled at a ground potential.

Description has been given thus far of the operation of circuits shown in FIGS. 3 and 4. The following advantages may result in reference to the aforesaid requirements, by adopting a combination of the address-inverter-buffer circuit with the timing signal Po:

(1) According to the embodiments of FIGS. 3 and 4, there is included a timing generating circuit required for the operation of the aforesaid buffer, while an address input signal and signal $\overline{\phi_{TTL}}$ alone are used as external input signals. In this circuit, a D.C. current flows only through MOST Q25 during the resetting and precharging period, and through MOST Q30 during the activated operational period, the other operations being all dynamic. The optimum dimensions of MOSTs lead to a low power consumption.

(2) The dimensions of MOST Q3 may be relatively reduced as has been described.

(3) The address input signal should be settled at an effective logic level until the signal $\phi_1$ is raised, and so maintained until there arises at the nodes 3 and 4 a difference in potential required for the flip-flop operation. The nodes 1, 3 and 4 are precharged by the signal Po, and remain at a floating high level at the beginning of an activated operational period, so that there results a prompt response and a accelerated latch function.

(4) A rising wave form of the same level as and synchronous with that of the signal $\phi_3$ may be derived for an output $\overline{A'}$, when the address input signal is at a low level, as well as for an output A', when the address input signal is at a high level. A low level below a threshold voltage may be maintained for an output A' when the input is at a low level, as well as for an output $\overline{A'}$, when the input is at a high level, by increasing the dimensions of MOST Q19 as compared with those of Q18, as well as by increasing the dimensions of MOST Q17, as compared with those of MOST Q16. Accordingly, logically well established and well balanced outputs may be derived for outputs A', and $\overline{A'}$.

By referring the circuits of FIGS. 3 and 4 and to the operational wave-forms shown in FIG. 5, description has been given of the low power address-inverter-buffer circuit according to the present invention, which provides a small address input terminal capacitance, and an accelerated latch function, and generates an output stable and well balanced, by introducing therein a timing adapted to be generated by receiving a TTL level clock.

Figure 6:
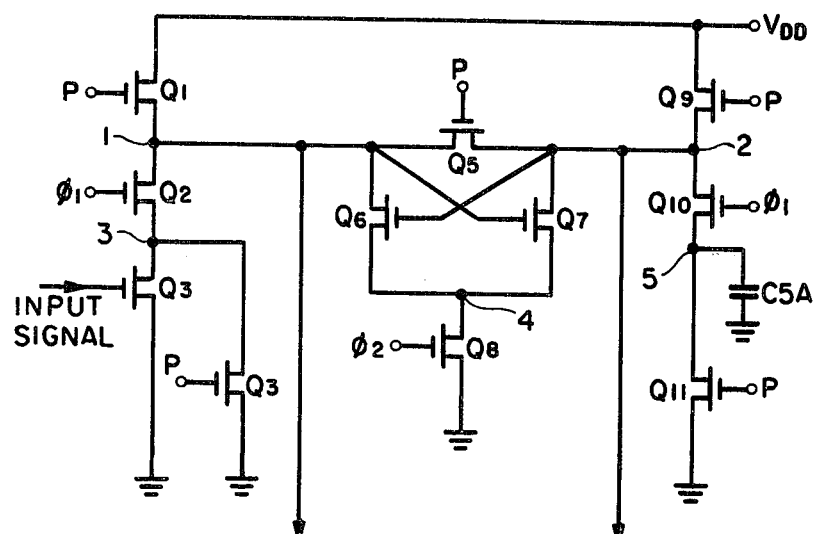
FIG. 6 is a circuit diagram showing another embodiment of the present invention.
Figure 7:
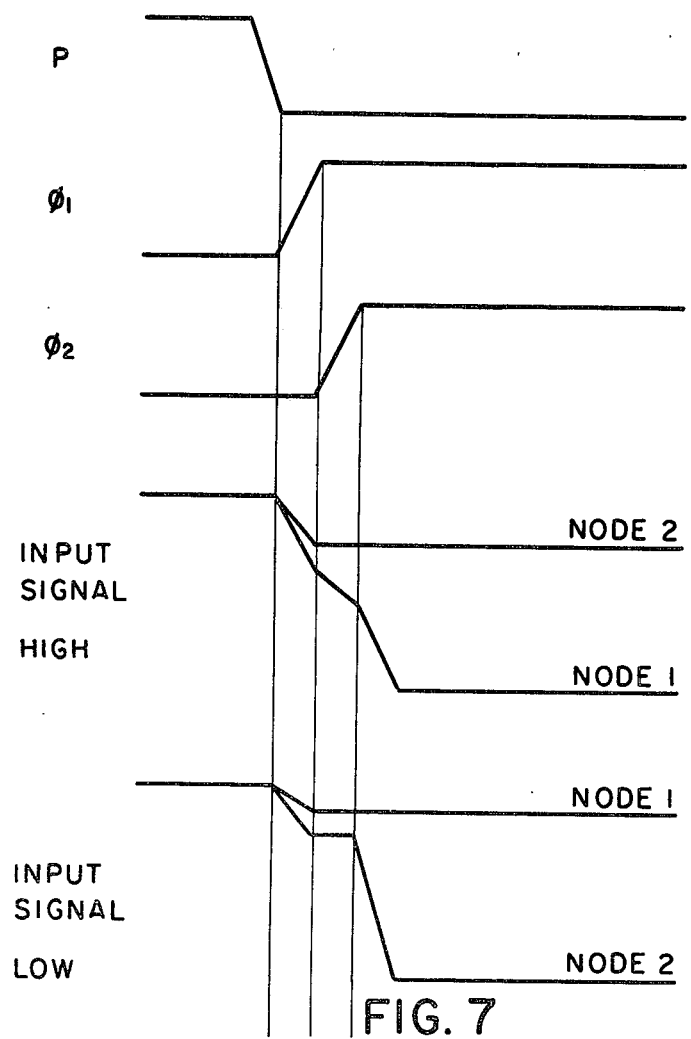
FIG. 7 is a wave-form diagram for explaining the operation of the circuit of FIG. 6.

The circuit arrangement shown in FIG. 6 can be used for the operations relating to clock signals $\phi_1$ and $\phi_2$. FIG. 7 shows clock timing signals and wave-forms at the main nodes in the circuit of FIG. 6. Assume that the high level of signal P is at a power source voltage $V_{DD}$, while the high level of the signals $\phi_1$, $\phi_2$ is at a level ($V_{DD}-V_T$). Immediately before the signal P is raised, the levels at the nodes 1 and 2 are charged to a level ($V_{DD}-V_T$), and the node 4 in charged to a level ($V_{DD}-2\times V_T$), while the node 3 and 5 are maintained at a ground potential. In case the signal $\phi_1$ is raised after the signal P has been brought to a low level, then the node 1 is shifted to a level:

$$V_1 = \frac{C_1}{C_1 + C_3} \times (V_{DD} - V_T) \qquad (8),$$

when the input signal is at a low level, while the node 1 is discharged through MOST Q2 and Q3 to a ground potential, when the input signal is at a high level. C1 and C3 in the equation (8) represent capacitances at the nodes 1 and 3, respectively. When the signal $\phi_1$ is raised, then the level at node 2 is shifted to a level:

$$V_2 = \frac{C_2}{C_2 + C_5} \times (V_{DD} - V_T) \qquad (9),$$

In this respect, C2 and C5 represent capacitances of the nodes 2 and 5, respectively. When an input signal is at a low level, the capacitance of C5 is increased by the additional capacitor C5A, thereby lowering the potential of the node 2, as compared with the potential at the node 1 by a decrement over off-set voltage of the flip-flop consisting of MOST Q6 and Q7. When an input signal is at a high level, the level at node 1 is lowered to a ground potential, so that after a certain time, the potential at node 1 is lowered as compared with the level at node 2 by a decrement over off-set voltage. When there arises at the nodes 1 and 2 a difference in potential of over off-set voltage, if the signal $\phi_2$ is raised, then the level at node 1 is maintained at a level of the equation (8), and the node 2 is shifted to a ground potential, when the input signal is at a low level. On the other hand, when the input signal is at a high level, the node 1 is shifted to a ground potential and the node 2 remains at a level of the equation (9). The operations thereafter remains unchanged as compared with use of FIGS. 1 and 2. The circuit of FIG. 6 may allow a further reduction in dimension of MOST Q3 in case where the input signal is of a MOS amplitude, so that the capacitance of C3 may be reduced. As a result, when the input signal is at a low level, the difference in potential between the nodes 1 and 2 may be increased.

As is apparent from the foregoing description of the circuit according to the present invention, there is provided a circuit which receives an input signal, and generates an amplified outputs of the phase the same as and opposite to the phase of the input signal, and which provides a small input capacitance, an accelerated latch function, logically stable output, and a low power operation, so that the circuit according to the present invention finds a wide application as a dynamic circuit.

I claim:

1. A transistor circuit comprising first and second nodes, a pair of cross-coupled transistors connected to said first and second nodes, means for operatively charging said first and second nodes with a first level, input means, including an input terminal, for determining the potential of said first node in accordance with an input signal applied to said input terminal, capacitance means, and switching means, arranged between said capacitance means and said second node for partially transferring electric charge stored in said second node at said first level into said capacitance means to change the potential of said second node to a second level lower than said first level in absolute value.

2. The transistor circuit of claim 1, further comprising means for deriving a first output signal and a second output signal from said first and second nodes, said second output signal being complementary in logic level with respect to said first output signal.

3. An amplifier circuit comprising first and second nodes, a pair of insulated-gate type field-effect transistors cross-coupled with each other and connected to said first and second nodes, first means coupled with said first and second nodes for adjusting potentials of said first and second nodes to a first level in a first time period, a capacitor, second means for coupling said second node to said capacitor to change, in a second time period the potential of said second node from said first level to a second level lower than said first level in absolute value, third means, coupled with said first node, and responsive to an input signal, for determining the potential of said first node to be either said first level or a third level which is lower than said second level in absolute value, and output means coupled with said first and second nodes for deriving a first output signal and a second output signal, said second output signal being complementary in logic level to said first output signal.

4. The amplifier circuit of claim 3, further comprising fourth means for activating the cross-coupled transistors in a third time period.

5. The amplifier circuit of claim 3, in which said second means includes a first switch connected between said second node and said capacitor, wherein said first switch sends a part of the charge at said second node to said capacitor in said second time period to lower the potential level of said second node to said second level.

6. The amplifier circuit of claim 5, in which said second means further includes means for discharging said capacitor before said second time period.

7. The amplifier circuit of claim 5, in which said first switch includes an insulated-gate type field-effect transistor connected between said second node and said capacitor, a gate of which is supplied with a timing signal for said second time period.

8. The amplifier circuit of claim 5, in which said third means includes a second switch for discharging charge at said first node in response to a predetermined state of said input signal to lower the potential level of said first node to said third level.

9. The amplifier circuit of claim 8, in which said second switch includes an insulated-gate type field-effect transistor connected through a d.c. current path between said first node and a common potential, a gate of which is supplied with said input signal.

10. The amplifier circuit of claim 8, in which said first means includes third and fourth switches connected respectively to said first and second nodes for charging said first and second nodes with a power supply in said first time period and a fifth switch connected between said first and second nodes for unifying potential levels of said first and second nodes in said first time period.

11. The amplifier circuit of claim 10, in which said output means includes a buffer circuit.

12. A semi-conductor circuit using insulated-gate type field-effect transistors comprising: a pair of insulated-gate type transistors whose sources are commonly connected and whose drains and gates are cross-connected; first switch means for connecting a common junction of said sources to a reference potential; first and second capacitors connected to respective drains of said pair of transistors; means for precharging said first and second capacitors to an equal potential; second switch means for discharging the precharged charges in said first capacitor dependent on and in response to a control input signal a third capacitor; and third switch means for dividing and allotting the pre-charged charges in said second capacitor to said third capacitor.

* * * * *